(12) United States Patent
Kou et al.

(10) Patent No.: US 8,552,720 B2
(45) Date of Patent: Oct. 8, 2013

(54) MOBILE INFORMATION TERMINAL APPARATUS AND MAGNETIC SENSOR, INCLUDING MAGNETORESISTIVE DETECTING DEVICE

(75) Inventors: Futoyoshi Kou, Miyagi (JP); Akihiro Fuse, Miyagi (JP); Junichi Azumi, Miyagi (JP)

(73) Assignee: Ricoh Company, Ltd., Tokyo (JP)

( * ) Notice: Subject to any disclaimer, the term of this patent is extended or adjusted under 35 U.S.C. 154(b) by 1084 days.

(21) Appl. No.: 12/403,424

(22) Filed: Mar. 13, 2009

(65) Prior Publication Data
US 2009/0237074 A1 Sep. 24, 2009

(30) Foreign Application Priority Data
Mar. 18, 2008 (JP) .................. 2008-069507

(51) Int. Cl.
*G01R 33/02* (2006.01)
(52) U.S. Cl.
USPC ........................... 324/247; 324/252
(58) Field of Classification Search
USPC .................. 324/247, 252; 338/32 R
See application file for complete search history.

(56) References Cited

U.S. PATENT DOCUMENTS

| | | | |
|---|---|---|---|
| 6,519,124 B1 | 2/2003 | Redon et al. | |
| 7,358,722 B2 * | 4/2008 | Peczalski et al. | 324/247 |
| 7,394,086 B2 * | 7/2008 | Wakui et al. | 324/252 |
| 7,642,733 B2 * | 1/2010 | Shen et al. | 315/307 |
| 2006/0176142 A1 * | 8/2006 | Naito et al. | 338/32 R |
| 2007/0035294 A1 * | 2/2007 | Peczalski et al. | 324/252 |
| 2007/0205766 A1 * | 9/2007 | Kou | 324/252 |
| 2008/0169807 A1 | 7/2008 | Naito et al. | |

FOREIGN PATENT DOCUMENTS

| | | |
|---|---|---|
| EP | 1860450 A1 | 11/2007 |
| JP | 2001-331913 | 11/2001 |
| JP | 2003-8101 | 1/2003 |
| JP | 3494921 | 11/2003 |
| JP | 2004-6752 | 1/2004 |
| JP | 2005-260064 | 9/2005 |
| JP | 2004-354182 | 12/2006 |
| JP | 3982611 | 7/2007 |

OTHER PUBLICATIONS

English machine translation of the detailed description of JP 2004-354182 A, obtained from the Japanese Patent Office Website, 30 pages, obtained on Sep. 27, 2011.*
Nov. 2, 2009 European search report in connection with a counterpart European patent application No. 09 25 0711.

* cited by examiner

*Primary Examiner* — Jermele M Hollington
*Assistant Examiner* — David M. Schindler
(74) *Attorney, Agent, or Firm* — Cooper & Dunham LLP (57) ABSTRACT

A disclosed magnetic sensor includes a substrate having a plane surface and multiple sloping surfaces; multiple soft magnetic films each disposed on a different one of the sloping surfaces and magnetized according to strength of a magnetic field; and multiple detecting devices each disposed on the plane surface, including a free layer and a pinned layer and configured to produce a detection output according to magnetization of the free layer and the pinned layer. Each of the soft magnetic films is magnetically coupled with the free layer of a different one of the detecting devices. The pinned layers of the detecting devices have magnetization directions different from each other.

10 Claims, 12 Drawing Sheets

FIG.1A

MAGNETIZATION DIRECTION OF PINNED LAYER

EASY DIRECTION OF MAGNETIZATION OF FREE LAYER

FIG.1B

DIRECTION FOR APPLYING MAGNETIZATION MAGNETIC FIELD TO PINNED LAYER

MOBILE INFORMATION TERMINAL APPARATUS AND MAGNETIC SENSOR, INCLUDING MAGNETORESISTIVE DETECTING DEVICE

BACKGROUND OF THE INVENTION

1. Field of the Invention

The present invention is directed to a magnetic sensor for detecting a magnetic-field vector component oriented in an out-of-plane direction of the substrate, such as the Z direction, using a simple method. The present invention is also directed to a mobile information terminal apparatus including such a magnetic sensor.

2. Description of the Related Art

Patent Document 1 is an example of this kind of conventional technology. According to the apparatus disclosed in Patent Document 1, in a GMR device, a permalloy thin film and the like are disposed on a sloping surface of an anisotropic etched Si substrate so that a magnetic field component in the Z direction is detected. Using this structure together with another sensor disposed on the plane surface of the substrate, the disclosed apparatus is able to detect magnetic field strength in three-axis directions (the X, Y and Z directions)

[Patent Document 1] Japanese Laid-open Patent Application Publication No. 2004-354182

According to the technology of Patent Document 1, a sensor unit needs to be provided on a sloping surface in order to detect a magnetic-field vector component oriented in an out-of-plane direction, such as the Z direction. However, for manufacturing reasons, the performance of a magnetoresistive device is severely affected by the flatness and smoothness of the sloping surface. Therefore, the conventional technology requires a manufacturing method allowing the substrate to have a sloping surface in excellent condition, and also leaves many problems in terms of the device formation on the sloping surface. Thus, it is difficult to provide a favorable magnetic sensor according to the conventional technology.

SUMMARY OF THE INVENTION

In view of the above problems, the present invention aims at providing a magnetic sensor capable of detecting a magnetic-field vector component oriented in the Z direction, which is a direction other than planer directions, even if all sensor units are disposed on the plane surface. The magnetic sensor employs well-known plane-surface prototype magnetic sensor units and only a simple additional process. The present invention also aims at providing a mobile information terminal apparatus including such a magnetic sensor.

One embodiment of the present invention has the following structure. That is, the structure includes a free layer and a pinned layer, and in the case of a TMR device, an insulating layer is provided between the free and pinned layers. In the case of a GMR device, a detecting device having a nonmagnetic metal and using a magnetoresistive effect is disposed on the plane surface of a substrate. The substrate has a groove or a projection with a sloping surface provided close to the detecting device. A soft magnetic layer to be magnetically coupled with the free layer is provided continuously over the plane surface of the substrate to the sloping surface. The soft magnetic layer and the detecting device together form one single-axis magnetic sensor.

Multiple signal-axis magnetic sensors are provided appropriately. When a heat treatment is performed in a magnetic field, a magnetic field is applied approximately perpendicular to the substrate, and each soft magnetic layer bends the applied magnetic field so that the applied magnetic field is oriented to a magnetic field application direction of a corresponding pinned layer. The magnetization direction of the pinned layer is established in accordance with the magnetic field application direction of the pinned layer. The angle of the sloping surface can be changed, and each of the pinned layers is able to have a magnetization direction different from the others. The magnetization directions of the pinned layers developed in the heat treatment in the magnetic field are the basis for detecting magnetic-field components of the magnetic sensor. By setting the magnetization directions of the multiple pinned layers, a magnetic sensor capable of detecting multi-axis components is provided.

According to a specific detecting method used by the magnetic sensor of one embodiment of the present invention, magnetic-field components horizontal to the plane surface of the substrate among three-dimensional magnetic-field vectors are detected using a free layer of a detecting device disposed on the plane surface. Since the soft magnetic layer provided continuously over the sloping surface and magnetically coupled with the free layer is magnetized by a magnetic-field component parallel to the sloping surface, the magnetically coupled free layer is also magnetized. Accordingly, the detecting device exhibits a change in resistance, thereby being able to detect a magnetic field component in the Z direction. Thus, even if the detecting device is disposed on the plane surface, the Z-direction vector component perpendicular to the plane surface of the substrate is detected due to the soft magnetic layer disposed on the sloping surface. Therefore, it is possible to cause detecting devices on the plane surfaces to operate as a three-axis (X, Y and Z) sensor.

DETAILED DESCRIPTION OF THE PREFERRED EMBODIMENTS

Embodiments that describe the best mode for carrying out the present invention are explained next with reference to the drawings.

(a) First Embodiment

Figure 1A:
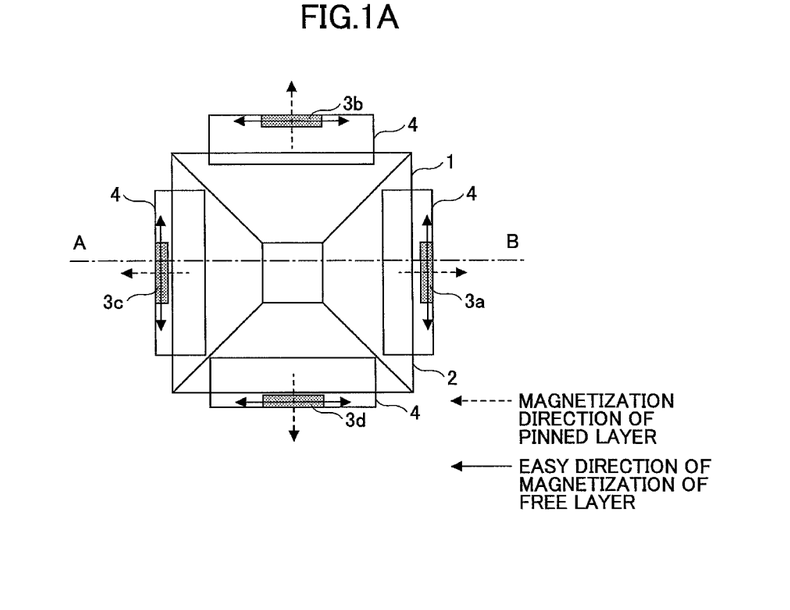
FIGS. 1A and 1B show the structure of the first embodiment of the present invention.
Figure 1B:
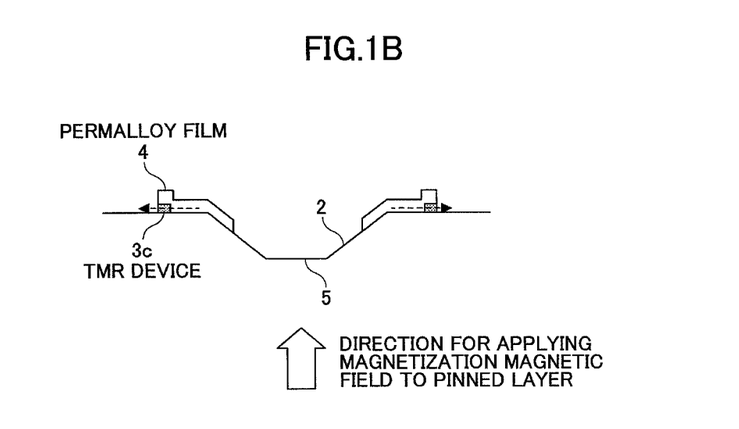

FIGS. 1A and 1B show the structure of a magnetic sensor of the first embodiment. FIG. 1A is a top view and FIG. 1B is a cross-sectional view along line AB. In FIGS. 1A and 1B, reference numeral 1 denotes a Si substrate; reference numeral 2 is a sloping surface on the substrate 1; reference numerals 3a through 3d denote four TMR devices (tunneling magnetoresistive devices) disposed on the plane surface of the substrate 1; reference numeral 4 denotes a permalloy film; and reference numeral 5 denotes a groove formed at the bottom of the sloping surfaces 2.

Each TMR device 3 includes a free layer and a pinned layer separated by an insulating layer. The easy direction of magnetization (solid line) of the free layer intersects the magnetization direction (dashed line) of the pinned layer at right angles. That is, the easy direction of magnetization of the free layer of each TMR device 3a through 3d is oriented along the longitudinal direction of the TMR device. As for the magnetization direction of each pinned layer according to FIG. 1, it is oriented from the left to the right in the TMR device 3a; from the bottom to the top in the TMR device 3b; from the right to the left in the TMR device 3c; and from the top to the bottom in the TMR device 3d.

Figure 2:
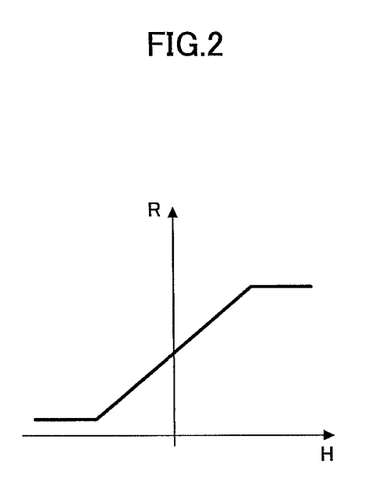
FIG. 2 shows a magnetoresistance curve used by a sensor.

The reason that the easy direction of magnetization of the free layer intersects the magnetization direction of the pinned layer at right angles is that a linear magnetoresistance of a magnetic body can be obtained by detecting the hard direction of magnetization of the magnetic body. FIG. 2 shows a magnetoresistance curve used by the sensor. Accordingly, the hard direction of magnetization of the free layer is the detection direction (magnetosensitive axis) of the sensor. The perpendicular intersection of the magnetization directions of the pinned layer and the free layer is achieved by, first, developing the magnetization of the pinned layer by annealing in a magnetic field in advance, then, arranging the magnetization direction of the pinned layer and that of the free layer to be perpendicular to each other, and performing an annealing process at a lowered temperature at which no change is made to the magnetization of the pinned layer. Note that the direction for applying a magnetization magnetic field to the pinned layer is a direction perpendicular to the substrate 1, as illustrated in FIG. 1.

In each TMR device 3, if the magnetization direction of the free layer is oriented in its hard direction of magnetization and also parallel to the magnetization direction of the pinned layer, a large tunnel current flows, whereby the TMR device 3 has a low resistance. On the other hand, if the magnetization direction of the free layer is antiparallel to the magnetization direction of the pinned layer, a reduced tunnel current flows, whereby the TMR device 3 has a high resistance. In other cases, the resistance shows a sinusoidal behavior with respect to the relative angle of the magnetization of the pinned and free layers.

The groove 5 is disposed, within the substrate 1, at the bottom of the sloping surfaces 2 provided close to the TMR devices 3. With respect to each TMR device 3, the permalloy film (soft magnetic layer) 4, which magnetically couples with the free layer of the TMR device 3, is provided continuously over the plane surface and the sloping surface 2 of the substrate 1. A set of one TMR device 3 and the permalloy film 4 forms a single-axis magnetic sensor unit. According to the present embodiment, multiple (four) single-axis magnetic sensor units are appropriately provided so as to form a three-axis (X, Y and Z) magnetic sensor.

Next is described the manufacturing process of the three-axis magnetic sensor of the present embodiment. Using KOH solution, anisotropic etching is performed on the Si (100) substrate 1 through openings created by photolithography, and the sloping surfaces 2 are provided in such a manner as to form a tetrahedral inverted pyramid structure with (111) surfaces. Subsequently, the layers of the TMR (tunneling magnetoresistive) devices 3 are sequentially deposited on the Si substrate 1 by a multiple-target high vacuum sputtering device. For the free layer, a desired material allowing its magnetic field to be detected is used. For example, in the case of using the three-axis magnetic sensor for geomagnetic detection, permalloy (Ni80Fe20) or the like may be used for the free layer. In the case of applying the three-axis magnetic sensor as an encoder, CoFe or the like may be used. A protective layer for the TMR devices 3 is then provided, and contact holes are formed. Among these contact holes, a contact hole formed on the top of each free layer is used for providing magnetic coupling.

The permalloy films (soft magnetic film) 4 are formed by a sputtering device using a shadow mask over the sloping surfaces 2. The sputtering device does not have to be a high vacuum sputtering device. Then, electrodes are formed also by sputtering using a shadow mask technique, whereby the three-axis magnetic sensor is completed. Instead of using the shadow mask technique, photolithography may be employed. In either of the techniques, relaxed design rules can be used for the formation operations compared to the formation of the detecting devices (i.e. the TMR devices 3), which contributes to better productivity. In other words, since the rules for the alignment are not rigid, the process level for the formation operations can be equivalent to that for a normal plane-surface prototype device, which enables trial production at low cost.

Permalloy, supermalloy or the like is suitable for the soft magnetic films 4 provided on the sloping surfaces 2. Or amorphous films, such as CoZrNb, may be used instead. Maximum sensitivity is usually obtained for the magnetic field entering each soft magnetic film 4 parallel to the film plane. Therefore, by coupling the soft magnetic film 4 provided on the sloping surface 2 with the free layer of the corresponding detecting device 3, it is possible to lead the magnetic flux in such a manner that maximum sensitivity is obtained for the magnetic field parallel to the soft magnetic film 4 on the sloping surface 2. Herewith, detection in a direction perpendicular to the layer plane of the detecting device 3 is able to be achieved. Accordingly, by integrating this sensor structure with other magnetic sensor units, a three-axis magnetic sensor can be formed.

According the above-described embodiment, the groove is provided at the bottom of the sloping surfaces; however, a similar magnetic sensor may be achieved with sloping surfaces on a pyramid (projected) structure. In addition, a similar sensor may also be achieved with sloping surfaces on an inverted or non-inverted trigonal pyramid, an inverted or non-inverted polyhedron or the like.

As for magnetization of the pinned layers, the magnetization magnetic field is applied to a direction perpendicular to the plane surface of the substrate. Accordingly, the magnetic flux is bent by each soft magnetic film on the sloping surface, and thus, it is possible to orient the magnetization of the corresponding free layer in a desired direction with respect to the magnetization direction of the pinned layer. Therefore, by each soft magnetic film, the magnetic flux in the vertical direction can be reoriented in a plane-surface direction of the substrate 1, thereby enabling the detection of each magnetic vector component.

Figure 3A:
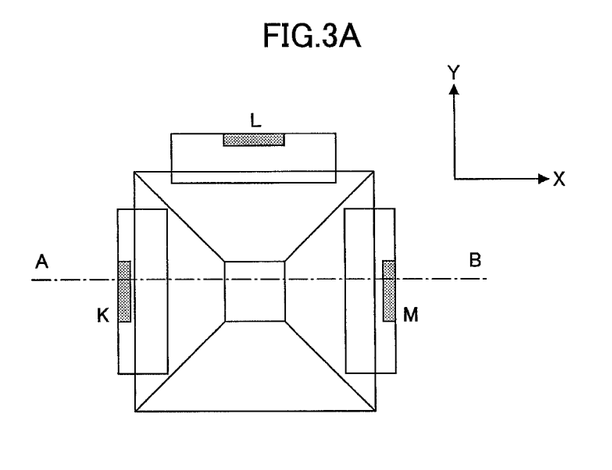
FIGS. 3A and 3B illustrate the operation of a magnetic sensor of one embodiment of the present invention.
Figure 3B:
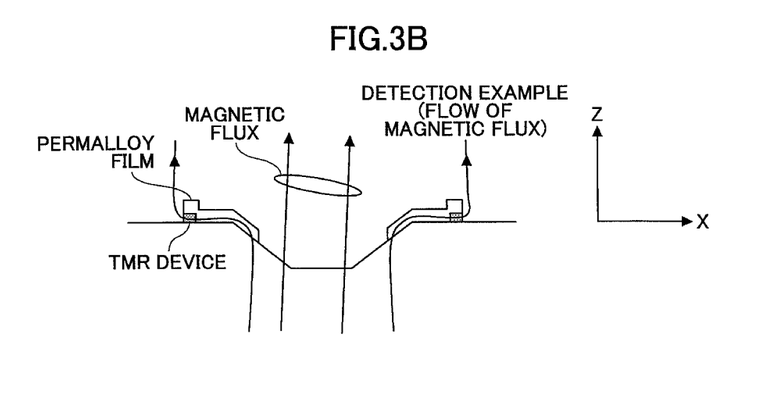
Figure 4:
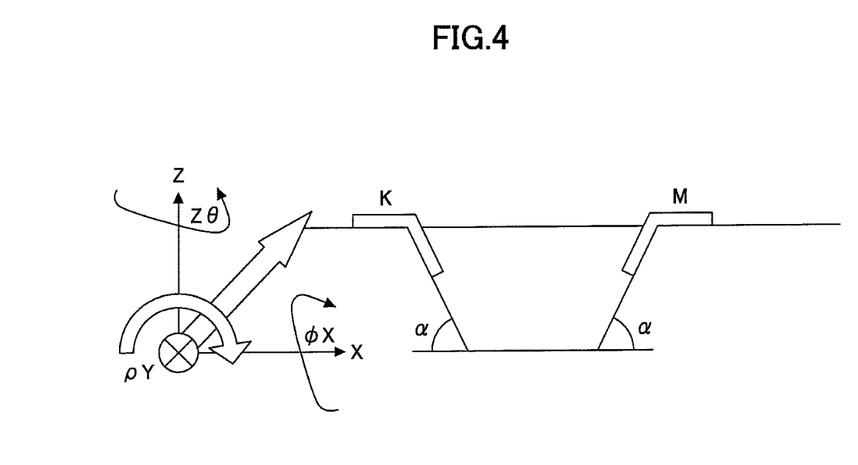
FIG. 4 illustrates a relationship between a direction of a magnetic field and angles ($\rho$, $\phi$ and $\ominus$)
Figure 5A:
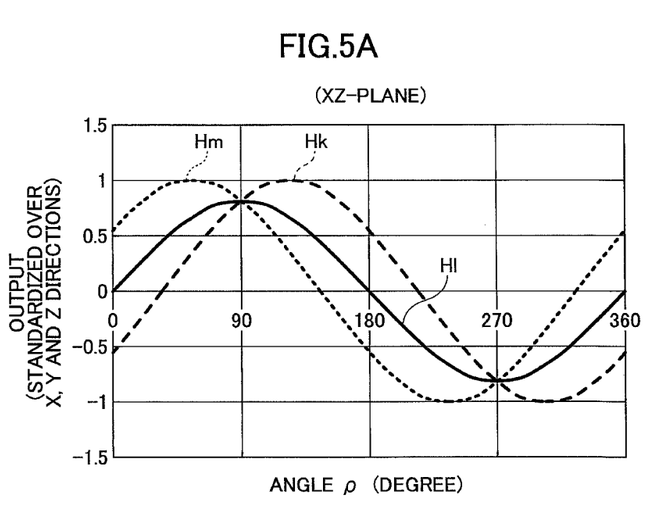
FIGS. 5A through 5C show angle dependence of outputs of magnetic sensor units K, M and L in different planes.
Figure 5B:
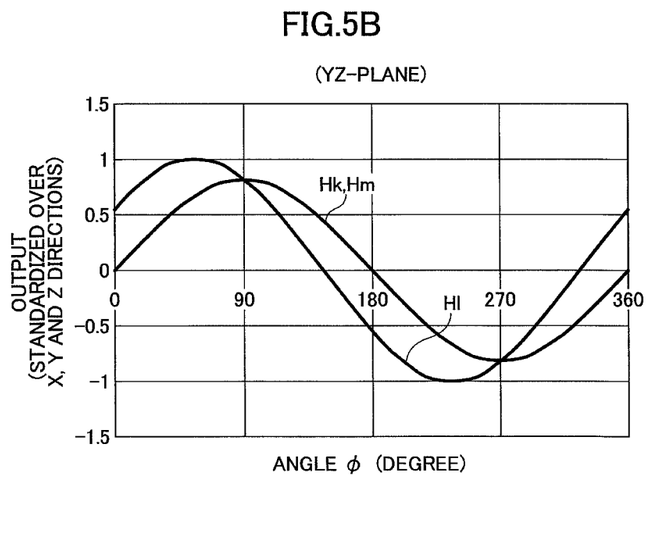
Figure 5C:
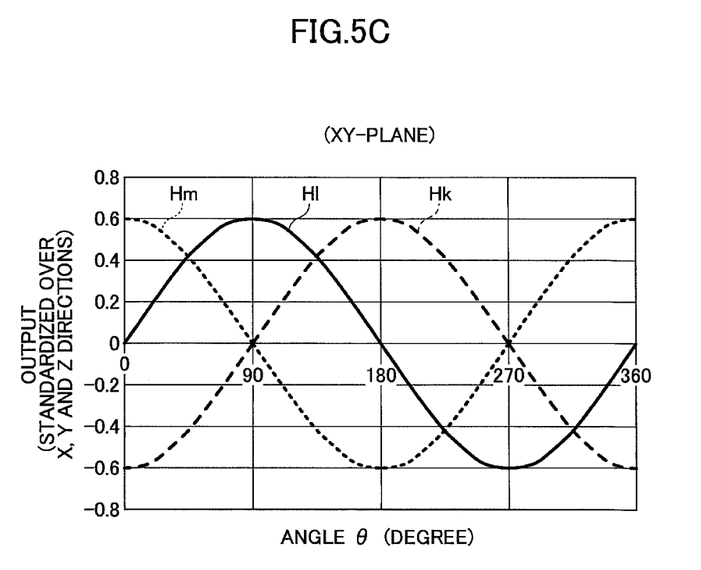

FIGS. 3 through 5 illustrate an operation of the magnetic sensor of the present embodiment. FIG. 3A is a top view in the X-Y plane, and FIG. 3B is a cross-sectional view of FIG. 3A along line AB (in the Z-X plane). Each reference symbol K, L and M of FIG. 3A denotes an integrated magnetic sensor unit of the TMR device 3 and the permalloy film 4. Next is described an example in which three of such magnetic sensor units are used (the three magnetic sensor units allow three-axis detection).

When an external magnetic field is present in the Z direction, the flow of the magnetic flux is changed by the permalloy films 4 on the sloping surfaces 2 and the magnetic flux reaches the TMR devices 3, as shown in FIG. 3B. Accordingly, the magnetization direction of the free layer of the TMR device 3 in the magnetic sensor unit M is changed to follow the magnetization direction of the corresponding pinned layer. Similarly, the magnetization direction of the free layer in each magnetic sensor unit K and L is changed to follow the magnetization direction of the corresponding pinned layer. As a result, each TMR device 3 is able to detect the Z-axis component of the magnetic field. The flow of the magnetic flux is originally oriented in the Z direction, which is usually difficult to detect. However, the flow of the magnetic flux is changed by the permalloy films disposed on the sloping surfaces, and can accordingly be detected.

The following describes that the flow directions changed by the permalloy films are different according to the direction of the magnetic flux, and accordingly, the three-axis detection is possible.

FIG. 4 illustrates a relationship between the direction of the magnetic field and angles (ρ, φ and ϴ). FIG. 4 also shows a positional relationship of the magnetic field and the angles with the magnetic sensor units K and M. Reference symbol α is an inclination angle of the sloping surface 2, for example, 54.7°, 30°, or 60°.

FIG. 5A shows the angle dependence characteristic of outputs (Hk, Hm and Hl) of the magnetic sensor units K, M and L on the angle ρ in the X-Z plane. FIG. 5B shows the angle dependence characteristic of outputs (Hk, Hm and Hl) of the magnetic sensor units K, M and L on the angle φ in the Y-Z plane (the outputs of the sensing units M and the device K overlap each other). FIG. 5C shows the angle dependence characteristic of outputs (Hk, Hm and Hl) of the magnetic sensor units K, M and L on the angle ϴ in the X-Y plane.

Once the values of Hk, Hm and Hl are obtained, the magnetic-field components in the X, Y and Z directions can be found by the following relational expressions.

$$Hx = -A*Hk/2 \cos\alpha + B*Hm/2 \cos\alpha;$$

$$Hy = -A*Hk/2 \cos\alpha + C*Hl/\cos\alpha - B*Hm/2 \cos\alpha; \text{ and}$$

$$Hz = A*Hk/2 \sin\alpha + B*Hm/2 \sin\alpha,$$

where A, B and C are correction values which are corrected in accordance with the sensitivities and the angles, and are calculated based on the outputs shown in FIGS. 5A through 5C and the angles ρ, φ and ϴ.

Once Hx, Hy and Hz are obtained, it is possible to express a specific direction as a solid angle, and therefore, a magnetic field in the specific direction can be determined. This allows a direction of, for example, an information terminal on which the magnetic sensor is mounted to be determined with respect to the geomagnetism.

Figure 6:
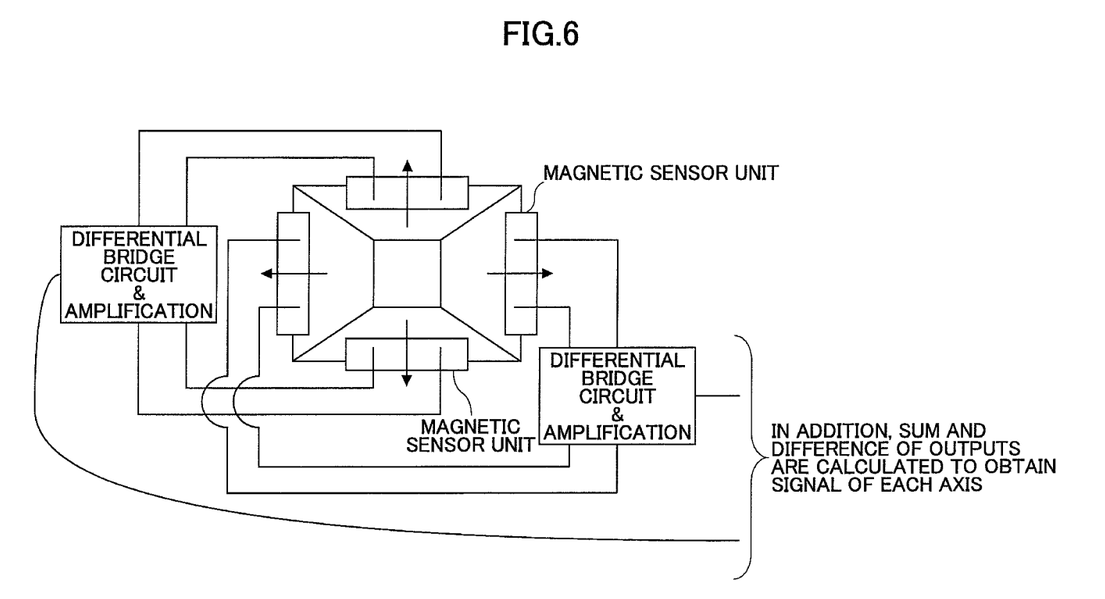
FIG. 6 shows an example in which a bridge circuit is formed using the magnetic sensor of one embodiment of the present invention.

FIG. 6 shows an example of a bridge circuit formed by using the magnetic sensor units of the present embodiment. Opposing magnetic sensor units are connected to the same differential bridge circuit, and the noise component is reduced. In addition, the sum and difference of the outputs of the differential bridge circuits are calculated so as to obtain a signal of each axis (X, Y and Z). The bridge circuit may have a full bridge or a half bridge configuration. Note that, for example, a bridge circuit may be formed by providing multiple magnetic sensor units K (or roughly similar to the magnetic sensor units K), and the effect of reducing the noise component is expected.

(b) Second Embodiment

Figure 7:
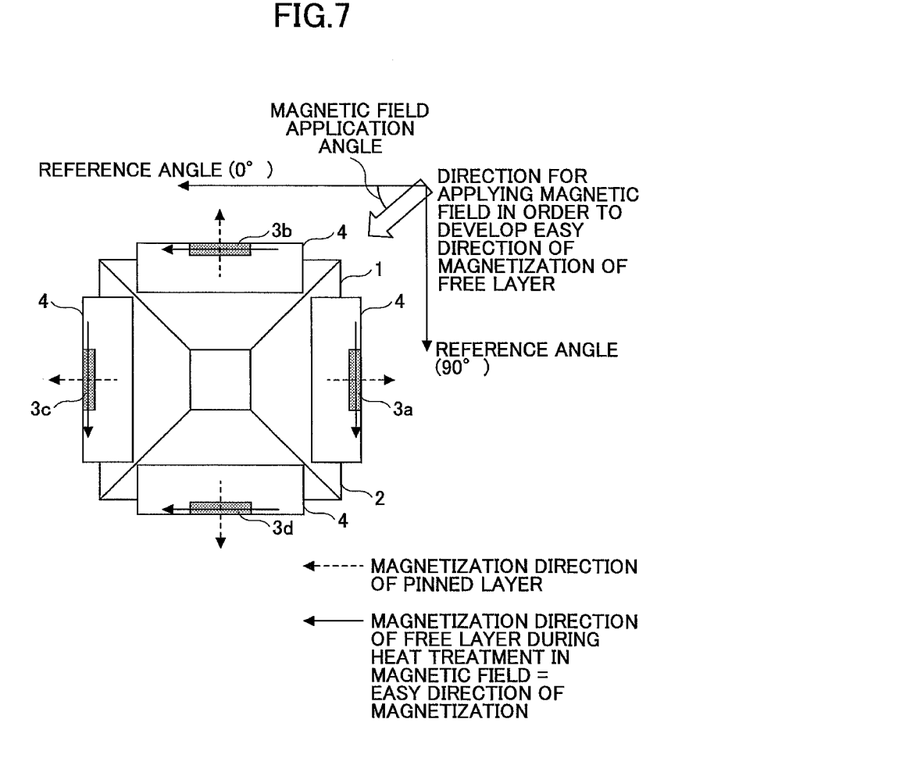
FIG. 7 shows the structure of the second embodiment of the present invention.

FIG. 7 shows the structure of the second embodiment of the present invention. Similar to the first embodiment, the detecting devices 3a through 3d, which are the TMR devices or the like, are disposed on the plane surface of the substrate 1. The soft magnetic films 4 are provided on the sloping surfaces 2. The magnetization of the pinned layer of each detecting device 3a through 3d is developed in a direction perpendicular to the corresponding sloping surface 2, as shown in FIG. 7. Subsequently, a magnetic field is applied so that the easy direction of magnetization of each free layer is developed in a direction perpendicular to the magnetization direction of the corresponding pinned layer. The magnetic field is applied in a direction roughly parallel to the layer plane of the detecting devices and oriented at a directional angle close to an average of directional angles of the longitudinal directions of the detecting devices, each of which has a rectangular shape.

That is to say, according to an example of FIG. 7, the directional angles of the longitudinal directions of the detecting devices are 0° and 90° (reference angles). Accordingly, the average of these directional angles, 45°, or an angle close to the average is the optimal direction for the magnetic field application. The angle for the magnetic field application may be changed between 0° and 90° when needed.

(c) Third Embodiment

Figure 8A:
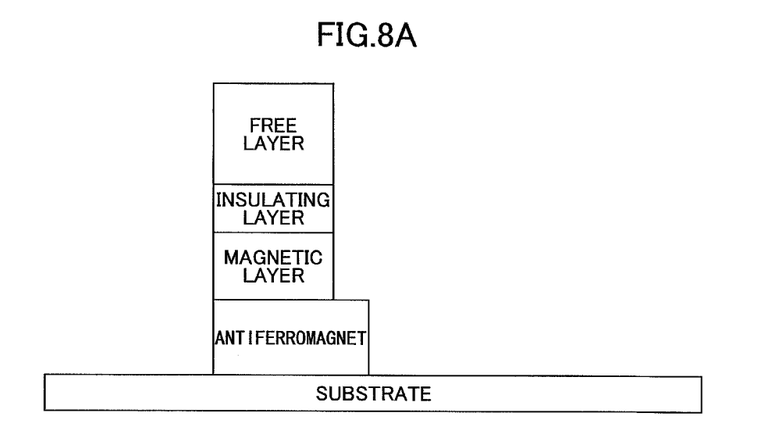
FIGS. 8A through 8C show the structures of the third embodiment of the present invention.
Figure 8B:
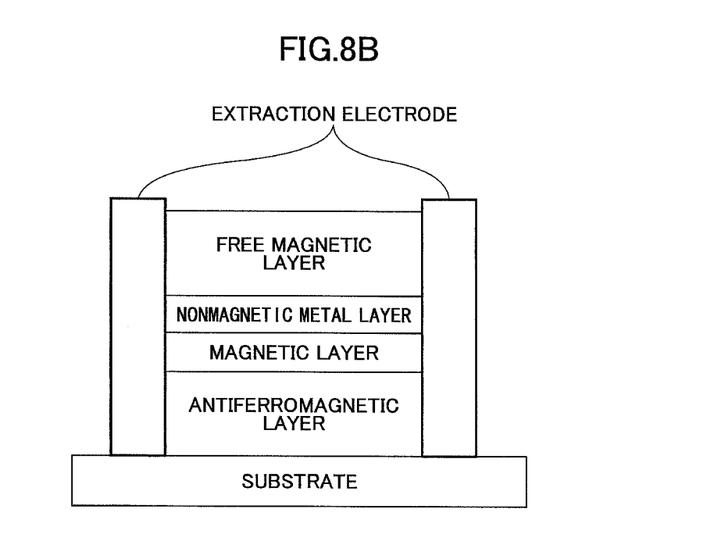
Figure 8C:
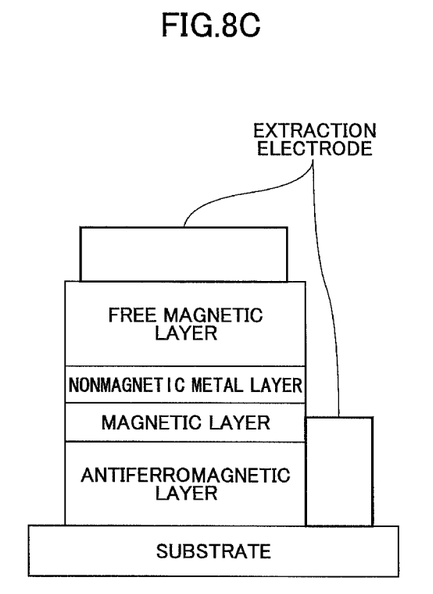

FIGS. 8A through 8C show structures of the third embodiment of the present invention. FIG. 8A illustrates one example of a layered structure of a TMR device. The TMR device includes a free layer, an insulating layer, a magnetic layer (pinned layer), an antiferromagnet and a substrate. The present invention is not limited to TMR devices, and may use other magnetoresistive devices, such as GMR (giant magnetoresistance) devices (FIG. 8B) including a nonmagnetic metal layer in place of the tunneling layer, or vertical GMR devices (FIG. 8C) passing an electric current vertically with respect to the layer plane. Each detecting device may be selected according to a target magnetic field strength, a required rate of change in the magnetic field and resistance necessary for a signal processing circuit.

(d) Fourth Embodiment

Figure 9A:
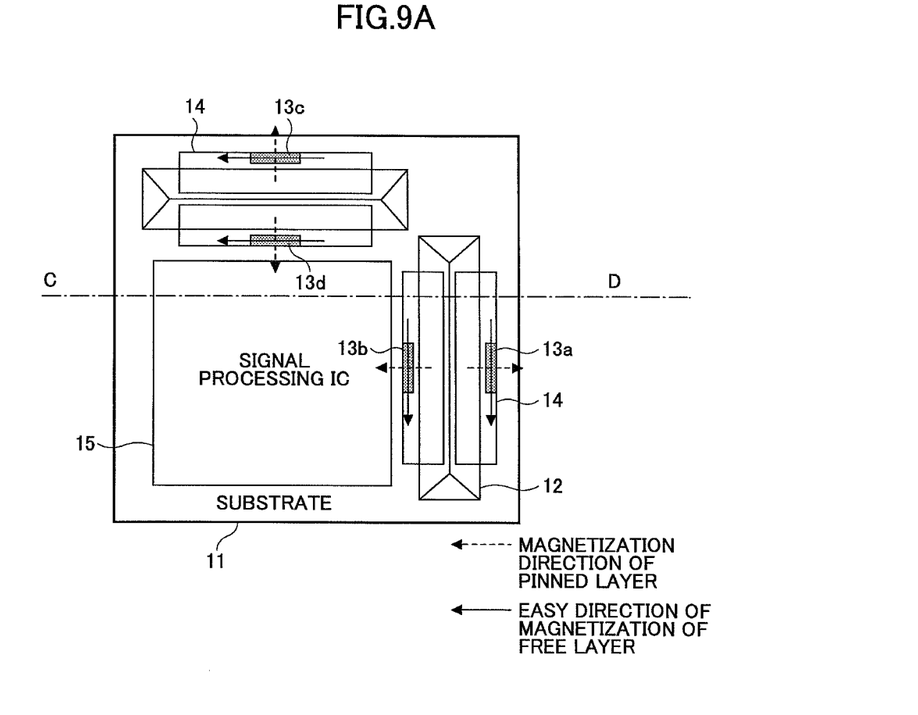
FIGS. 9A and 9B show the structure of the fourth embodiment of the present invention.
Figure 9B:
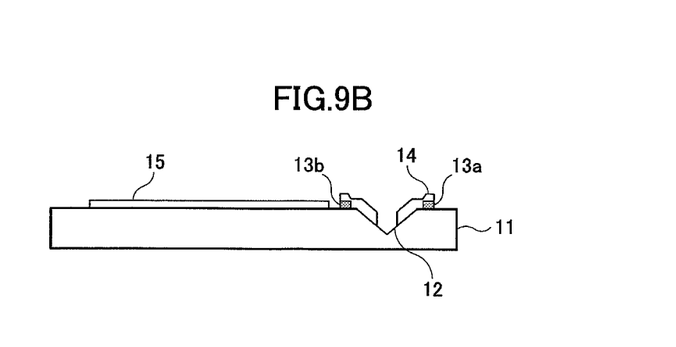

FIGS. 9A and 9B show the structure of the fourth embodiment of the present invention. The fourth embodiment illustrates an example in which the magnetic sensor according to one embodiment of the present invention and a signal processing IC circuit are formed on a substrate. FIG. 9A is a top view and FIG. 9B is a cross-sectional view along line CD. In FIGS. 9A and 9B, reference numeral 11 denotes a substrate; reference numeral 12 denotes a groove with sloping surfaces; reference numerals 13a through 13d denote TMR devices; reference numeral 14 denotes a permalloy film (soft magnetic film); and reference numeral 15 denotes a signal processing IC. In the magnetic sensor according to the fourth embodiment, the TMR devices 13a through 13d are disposed around the periphery of the signal processing IC 15 in such a manner that the longitudinal directions of the TMR devices 13a and 13b are perpendicular to those of the TMR devices 13c and 13d. The operation of the magnetic sensor of the fourth embodiment is the same as that of the first embodiment.

According to the fourth embodiment, the grooves 12 are separately provided, which allows more flexibility in the size of each detecting device. The magnetic sensor according to one embodiment of the present invention has such advantages in that each detecting device readily exhibits its characteristic due to the rectangular shape and the easy direction of magnetization of its free layer is easily developed in the longitudinal direction of the detecting device due to shape anisotropy. In order to make all the magnetic sensor units have equal sensitivity, it is usually advantageous to form them in the same shape with a constant area and the like. This is preferable also from the standpoint of processing efficiency. Accordingly, the magnetic sensor units, each of which has a rectangular shape largely stretched in its longitudinal direction, are disposed on the outer edges as shown in FIG. 9A. Since two separate grooves are provided and two magnetic sensor units are allocated to each groove, the detecting devices require less area. In addition, the configuration provides a large, flat area in the center of the substrate, which can be used to accommodate a signal processing IC for the magnetic sensor, sensors other than the magnetic sensor, such as an acceleration sensor and a gyro sensor, a general control IC and the like. Thus, it is possible to effectively use the substrate area.

In the present embodiment, each groove is provided at the bottom of the sloping surfaces, as in the first embodiment; however, a similar magnetic sensor may be achieved with sloping surfaces on a pyramid (projected) structure. In addition, a similar sensor may also be achieved with sloping surfaces on an inverted or non-inverted trigonal pyramid, an inverted or non-inverted polyhedron or the like. As for the dimensions of the rectangular magnetic sensor unit, the optimum dimensional ratio is L/W≥6, where L is the length of the long side (in the longitudinal direction) and W is the length of the short side. Practically, if L/W≤1000, the manufacturing operation does not require a special processing technique. Yet, L/W≤100 is more preferable. The magnetic sensor unit of the present invention is not limited to a rectangular shape, and may have a partially overall elliptical shape, or may have an elliptical or round shape. Also in the case of having an overall elliptical shape or having a partially elliptical shape, the ratio between a major axis A and a minor axis B (as well as the ratio between a longer side A' and a shorter side B' in whole) is preferably 6≤A/B (A'/B')≤100, as in the case of having a rectangular shape.

(e) Fifth Embodiment

Figure 10:
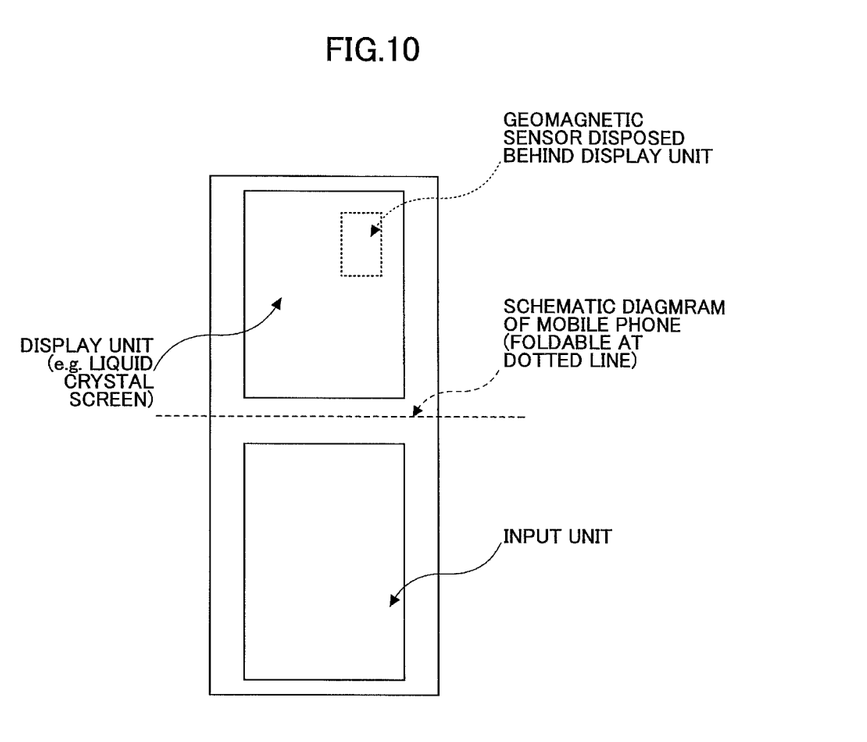
FIG. 10 shows the structure of the fifth embodiment of the present invention.

FIG. 10 shows the structure of the fifth embodiment of the present invention. The fifth embodiment illustrates an example in which the magnetic sensor according to one embodiment of the present invention is mounted on a mobile phone. In this example, the magnetic sensor is disposed behind its display screen, and the display difference is small even when the mobile phone is folded (The mobile phone is foldable at the dotted line; however, also with an unfoldable mobile phone, the performance can be sufficiently achieved). The magnetic sensor of one embodiment of the present invention allows downsizing, and is not subjected to restrictions in terms of where to be installed. Accordingly, the magnetic sensor of one embodiment of the present invention can be mounted on a mobile information terminal, such as a mobile phone.

This application is based on Japanese Patent Application No. 2008-069507 filed on Mar. 18, 2008, the contents of which are hereby incorporated herein by reference.

What is claimed is:

1. A magnetic sensor comprising:
a substrate having a plane surface and a plurality of sloping surfaces;
a plurality of soft magnetic films, each soft magnetic film amongst the soft magnetic films being disposed on a corresponding sloping surface of the sloping surfaces and being magnetized according to strength of a magnetic field; and
a plurality of detecting devices, each detecting device being disposed on the plane surface and including a free layer and a pinned layer, and being configured to produce a detection output according to magnetization of the free layer and the pinned layer;
wherein each soft magnetic film amongst the soft magnetic films is magnetically coupled with the free layer of a corresponding detecting device of the detecting devices, and is disposed on the sloping surface and on the plane surface,
the pinned layers of the detecting devices have magnetization directions different from each other, and
each of the detecting devices is a magnetoresistive device which is one of a tunneling magnetoresistive device and a giant magnetoresistance device.

2. The magnetic sensor as claimed in claim 1, wherein for at least one specific detecting device amongst the plurality of detecting devices, the free layer of the specific detecting device has an easy direction of magnetization in a longitudinal direction of the specific detecting device due to shape anisotropy of the free layer, and the magnetization direction of the pinned layer of the specific detecting device is perpendicular to the easy direction of magnetization of the free layer of the specific detecting device.

3. The magnetic sensor as claimed in claim 1, wherein the magnetization direction of each of the pinned layers is perpendicular to a longitudinal direction of a corresponding one of the free layers, and each of the free layers has an easy direction of magnetization developed by applying a magnetic field at an angle of an angular value which is an average of directional angles of respective longitudinal directions of the plurality of detecting devices.

4. The magnetic sensor as claimed in claim 1, wherein
the pinned layers are magnetized by, in heat treatment, applying a magnetic field substantially perpendicular to the plane surface of the substrate so as to obtain the magnetization directions of the respective pinned layers.

5. The magnetic sensor as claimed in claim 2, wherein
the pinned layers are magnetized by, in heat treatment, applying a magnetic field substantially perpendicular to the plane surface of the substrate so as to obtain the magnetization directions of the respective pinned layers.

6. The magnetic sensor as claimed in claim 3, wherein
the pinned layers are magnetized by, in heat treatment, applying a magnetic field substantially perpendicular to the plane surface of the substrate so as to obtain the magnetization directions of the respective pinned layers.

7. A magnetic sensor comprising:
a multi-axis magnetic sensor unit;
an integrated circuit configured to have a predetermined function; and
a substrate on which both the multi-axis magnetic sensor unit and the integrated circuit are disposed, the substrate having a plane surface and a plurality of sloping surfaces;
wherein the multi-axis magnetic sensor unit includes a plurality of single-axis magnetic sensors, each of the single-axis magnetic sensors including a soft magnetic film disposed on a different one of the sloping surfaces and being magnetized according to strength of a magnetic field, and a detecting device disposed on the plane surface and including a free layer and a pinned layer and configured to produce a detection output according to magnetization of the free layer and the pinned layer, and wherein for said each of the single-axis magnetic sensors, the corresponding soft magnetic film is magnetically coupled with the free layer of the corresponding detecting device, and the corresponding soft magnetic film is disposed on the corresponding sloping surface and on the plane surface, and the pinned layer of the corresponding detecting device has a magnetization direction different from magnetization directions of pinned layers of other ones of the single-axis magnetic sensors included in the multi-axis magnetic sensor unit, and the plurality of single-axis magnetic sensors are disposed around a periphery of the integrated circuit, and the detecting device is a magnetoresistive device which is one of a tunneling magnetoresistive device and a giant magnetoresistance device.

8. The magnetic sensor as claimed in claim 7, wherein the magnetic sensor is monolithic.

9. A mobile information terminal apparatus having a magnetic sensor including:

a substrate having a plane surface and a plurality of sloping surfaces;

a plurality of soft magnetic films, each soft magnetic film amongst the soft magnetic films being disposed on a corresponding sloping surface of the sloping surfaces and being magnetized according to strength of a magnetic field; and a plurality of detecting devices, each detecting device being disposed on the plane surface and including a free layer and a pinned layer, and being configured to produce a detection output according to magnetization of the free layer and the pinned layer;

wherein said each soft magnetic film amongst the soft magnetic films is magnetically coupled with the free layer of a corresponding detecting device amongst the detecting devices and is disposed on the corresponding sloping surface and on the plane surface, the pinned layers of the detecting devices have magnetization directions different from each other, and each of the detecting devices is a magnetoresistive device which is one of a tunneling magnetoresistive device and a giant magnetoresistance device.

10. A mobile information terminal apparatus having a magnetic sensor including:

a multi-axis magnetic sensor unit;

an integrated circuit configured to have a predetermined function; and a substrate on which both the multi-axis magnetic sensor unit and the integrated circuit are disposed, the substrate having a plane surface and a plurality of sloping surfaces;

wherein the multi-axis magnetic sensor unit includes a plurality of single-axis magnetic sensors, each of which includes a soft magnetic film disposed on a different one of the sloping surfaces and magnetized according to strength of a magnetic field, and a detecting device disposed on the plane surface and including a free layer and a pinned layer and configured to produce a detection output according to magnetization of the free layer and the pinned layer, wherein for each of the plurality of single-axis magnetic sensors, the corresponding soft magnetic film is magnetically coupled with the free layer of the corresponding detecting device, the corresponding soft magnetic film is disposed on the corresponding sloping surface and on the plane surface, and the pinned layer of the corresponding detecting device has a magnetization direction different from magnetization directions of pinned layers of other ones of the single-axis magnetic sensors included in the multi-axis magnetic sensor unit, and wherein the single-axis magnetic sensors are disposed around a periphery of the integrated circuit, and the detecting device is a magnetoresistive device which is one of a tunneling magnetoresistive device and a giant magnetoresistance device.

* * * * *